United States Patent
Katsuki et al.

(10) Patent No.: US 7,176,903 B2
(45) Date of Patent: Feb. 13, 2007

(54) PIEZOELECTRIC ELEMENT AND TOUCH SCREEN UTILIZING THE SAME

(75) Inventors: Takashi Katsuki, Kawasaki (JP); Fumihiko Nakazawa, Kawasaki (JP); Satoshi Sano, Kawasaki (JP); Yuji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 574 days.

(21) Appl. No.: 10/781,791

(22) Filed: Feb. 20, 2004

(65) Prior Publication Data

US 2005/0073505 A1    Apr. 7, 2005

(30) Foreign Application Priority Data

Oct. 7, 2003    (JP) .............................. 2003-348226

(51) Int. Cl.
*G09G 5/00*    (2006.01)
(52) U.S. Cl. ........................................ 345/173; 345/174
(58) Field of Classification Search ............ 178/18.01, 178/18.04, 19.02; 310/313, 311, 363; 345/156, 345/173, 174, 177
See application file for complete search history.

(56) References Cited

U.S. PATENT DOCUMENTS

| | | | | |
|---|---|---|---|---|
| 4,456,847 A | * | 6/1984 | Minagawa et al. | ...... 310/313 R |
| 5,854,450 A | * | 12/1998 | Kent | ........................ 178/18.04 |
| 5,986,224 A | * | 11/1999 | Kent | ........................ 178/18.04 |
| 5,994,817 A | * | 11/1999 | Toda | ...................... 310/313 R |
| 6,590,569 B1 | * | 7/2003 | Toda | ........................... 345/173 |
| 2003/0038789 A1 | | 2/2003 | Nakazawa et al. | |
| 2003/0067448 A1 | * | 4/2003 | Park | ............................ 345/173 |
| 2003/0132683 A1 | * | 7/2003 | Yamada et al. | ............. 310/346 |
| 2004/0061688 A1 | * | 4/2004 | Nakayama et al. | ......... 345/173 |
| 2006/0017750 A1 | * | 1/2006 | Asao | .......................... 345/690 |

FOREIGN PATENT DOCUMENTS

| | | |
|---|---|---|
| JP | 54-52958 | 4/1979 |
| JP | 06-149459 | 5/1994 |
| JP | 08-18388 | 1/1996 |
| JP | 08-130435 | 5/1996 |
| JP | 10-55240 | 2/1998 |
| JP | 10-135773 | 5/1998 |
| JP | 10-178330 | 6/1998 |
| JP | 2001-196895 | 7/2001 |
| JP | 2001-196896 | 7/2001 |
| JP | 2002-16469 | 1/2002 |
| JP | 2002-26687 | 1/2002 |
| JP | 2002-141768 | 5/2002 |
| JP | 2003-37467 | 2/2003 |
| WO | WO 96/23292 | 8/1996 |

* cited by examiner

*Primary Examiner*—Nitin Patel
(74) *Attorney, Agent, or Firm*—Westerman, Hattori, Daniels & Adrian, LLP.

(57) ABSTRACT

A piezoelectric element includes a substrate, a lower electrode on the substrate, a piezoelectric layer on the lower electrode, and an upper electrode on the piezoelectric layer. The upper electrode includes a common base and a plurality of parallel branches extending from the base. The branches are arranged at a regular interval or pitch $\lambda_1$. The lower electrode faces the branches of the upper electrode via the piezoelectric layer. The thickness h of the piezoelectric layer and the branch pitch $\lambda_1$ are determined to satisfy an inequality $0.005 \leq h/\lambda_1 \leq 0.1$. The lower electrode has a hillock occurrence rate which is no greater than 0.1%.

8 Claims, 11 Drawing Sheets

PIEZOELECTRIC ELEMENT AND TOUCH SCREEN UTILIZING THE SAME

BACKGROUND OF THE INVENTION

1. Field of the Invention

The present invention relates to a piezoelectric element to generate or receive surface acoustic waves. The present invention also relates to a SAW touch screen incorporating piezoelectric elements used as a wave generator or receiver.

2. Description of the Related Art

Touch screens or touch panels are used as data input units to enable users to interact with a computer system for e.g. factory automation equipment, office automation equipment or automatic measuring device. As known, a touch screen is a force-sensitive device designed to detect an area on the screen that the user touches with his or her finger, for example. The computer system performs required data processing based on the information of a location detected by the touch screen and other necessary data.

Recently, attention has been drawn to "SAW" touch screens in which the touched area is detected based on the surface acoustic wave (SAW). A typical SAW touch screen includes a transparent substrate that has a detection region and a marginal region surrounding the detection region. The marginal region is provided with a plurality of piezoelectric elements as a wave generator or wave receiver. Examples of SAW touch screens are disclosed in Japanese patent application laid-open Nos. H06-149459 and H10-55240.

A conventional piezoelectric element used as a wave generator or receiver is constituted by an interdigitated transducer (IDT) patterned on the marginal region for each element and a piezoelectric layer formed on the marginal region to cover the IDT. The IDT consists of a pair of comb-like conductors each having a prescribed number of parallel electrode fingers (conductive branches). The electrode fingers of one comb-like conductor are arranged alternately with and parallel to those of the other comb-like conductor. The piezoelectric layer is formed of a piezoelectric material, which exhibits the piezoelectric effect (generation of electric polarization as a result of the application of mechanical stress) and the reverse piezoelectric effect (production of a mechanical distortion as a result of the application of a voltage).

Upon application of an alternating voltage to the IDT of a piezoelectric element, an electric field is generated between adjacent electrode fingers. As a result, mechanical distortions occur in the piezoelectric layer due to the reverse piezoelectric effect, thereby producing elastic waves in the piezoelectric layer. In this process, the most strongly excited wave is a wave whose wavelength is equal to the pitch of the electrode fingers of the IDT. The produced elastic waves propagate along the surface of the substrate, to reach the wave-receiving piezoelectric elements. At these wave receivers, alternating electric fields are generated between the electrode fingers of the IDT due to the piezoelectric effect in the piezoelectric layer. Accordingly, an electromotive force is produced, and an alternating current is outputted from the IDT.

In operation of the SAW touch screen, the wave-generating piezoelectric elements produce surface acoustic waves. The surface acoustic waves propagate through the detection region of the substrate, to be received by particular piezoelectric elements serving as the wave receivers. When a finger is held in contact with an area in the detection region, the amplitude of the surface acoustic wave decreases as the wave passes through the contact point. The damping of the wave is detected and analyzed to locate the contact point in the detection region.

In a SAW touch screen, the electromechanical conversion rate of the piezoelectric elements should be as high as possible for attaining reduction of the driving voltage and for improving the detection accuracy. Specifically, with a high electromechanical conversion rate, each piezoelectric element can generate elastic waves efficiently in response to the applied voltage (when used as a wave generator), or can output an alternating current efficiently in response to the received elastic wave (when used as a wave receiver). In such a situation, the insertion loss between input and output signals for piezoelectric elements is small, whereby the reduction of driving voltage and the improvement of detection accuracy are realized.

In the conventional SAW touch screens, however, the piezoelectric elements do not have a sufficiently high electro-mechanical conversion rate for attaining a desired reduction of the driving voltage and improvement of the detection accuracy.

SUMMARY OF THE INVENTION

The present invention has been proposed under the circumstances described above. It is, therefore, an object of the present invention to provide a piezoelectric element having a higher electromechanical conversion rate than the conventional elements. Another object of the present invention is to provide a SAW touch screen incorporating such a piezoelectric element for use as a wave generator or wave receiver.

According to a first aspect of the present invention, there is provided a piezoelectric element comprising: a substrate; a piezoelectric layer having a first surface and a second surface opposite to the first surface, the first surface facing the substrate, the piezoelectric layer having a thickness h; a first electrode arranged between the substrate and the first surface of the piezoelectric layer; and a second electrode held in contact with the second surface of the piezoelectric layer. One of the first electrode and the second electrode includes a common base and a plurality of parallel branches extending from the base and spaced from each other by a prescribed pitch $\lambda$. The other of the first electrode and the second electrode includes a portion that faces the branches via the piezoelectric layer. The thickness h of the piezoelectric layer and the branch pitch $\lambda$ are determined to satisfy an inequality $0.005 \leq h/\lambda \leq 0.1$. In addition, the first electrode has a hillock occurrence rate which is no greater than 0.1%.

The above-formulated setting of the thickness h and the pitch $\lambda$ is advantageous for providing a high electro-mechanical conversion rate in the piezoelectric element. In the prior art devices, however, a sufficiently high electro-mechanical conversion rate fails to be obtained as the thickness h of the piezoelectric layer is made smaller, even if the above relation $0.005 \leq h/\lambda \leq 0.1$ is observed. In light of this, according to the present invention, the hillock occurrence rate of the first electrode is no greater than 0.1%. The inventors have found that such a low hillock occurrence rate ensures a required high electromechanical conversion rate even when the thickness h of the piezoelectric layer is very small (on the order of micrometers, for example). The definition of the hillock occurrence rate is found in DETAILED DESCRIPTION OF THE PREFERRED EMBODIMENTS below.

Preferably, the common base and the branches may belong to the first electrode.

Preferably, the first electrode may be formed of an aluminum alloy containing 0.1~3.0 wt % of a metal selected from a group consisting of Ti, Cr, Ni, Cu, Zn, Pd, Ag, Hf, W, Pt and Au. This arrangement serves to make the hillock occurrence rate of the first electrode equal to or lower than 0.1%. This is because the aluminum alloy has a smaller coefficient of thermal expansion than pure aluminum.

Preferably, the piezoelectric layer may be formed of ZnO doped with Mn. This arrangement is advantageous for preventing e.g. Al contained in the first electrode from diffusing into the piezoelectric layer. As a result, the piezoelectric element can maintain the high electro-mechanical conversion rate.

According to a second aspect of the present invention, there is provided a touch screen comprising: a substrate including a detection region and a marginal region surrounding the detection region; a wave generator arranged in the marginal region for generating a surface acoustic wave in the substrate; and a wave receiver arranged in the marginal region for receiving the surface acoustic wave. Further, each of the wave generator and the wave receiver comprises: a piezoelectric layer having a first surface facing the substrate and a second surface opposite to the first surface, the piezoelectric layer having a thickness h; a first electrode arranged between the substrate and the first surface of the piezoelectric layer; and a second electrode held in contact with the second surface of the piezoelectric layer. One of the first electrode and the second electrode includes a common base and a plurality of parallel branches extending from the base, the branches being spaced from each other by a pitch $\lambda$. The other of the first electrode and the second electrode includes a portion that faces the branches via the piezoelectric layer. As in the piezoelectric element of the first aspect, the thickness h and the pitch $\lambda$ are determined to satisfy an inequality $0.005 \leq h/\lambda \leq 0.1$, and the first electrode has a hillock occurrence rate which is no greater than 0.1%.

Preferably, the common base and the branches may belong to the first electrode. The first electrode may be formed of an aluminum alloy containing 0.1~3.0 wt % of a metal selected from a group consisting of Ti, Cr, Ni, Cu, Zn, Pd, Ag, Hf, W, Pt and Au. The piezoelectric layer may be formed of ZnO doped with Mn.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
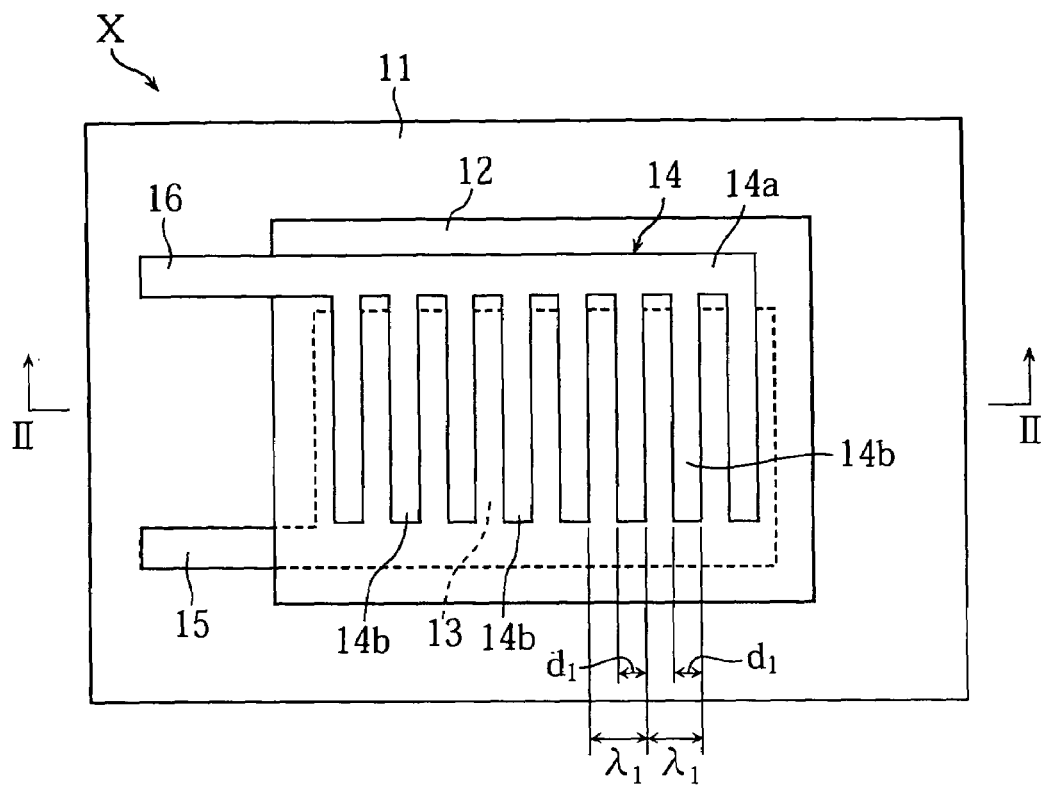
FIG. 1 is a plan view showing a piezoelectric element according to a first embodiment of the present invention.
Figure 2:
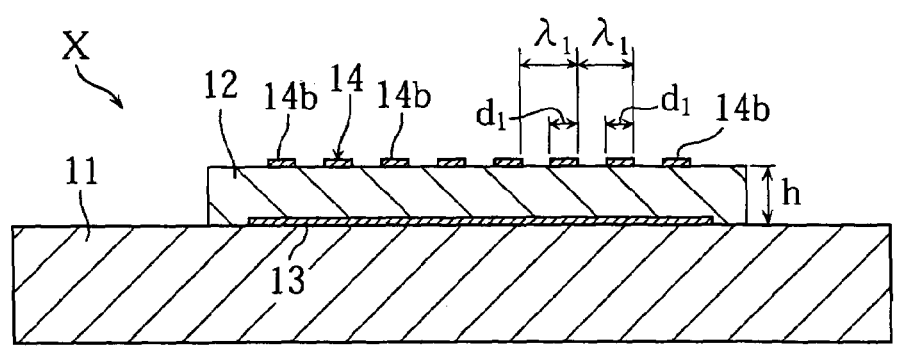
FIG. 2 is a sectional view taken along lines II—II in FIG. 1.

Reference is first made to FIGS. 1 and 2 illustrating a piezoelectric element X according to a first embodiment of the present invention. FIG. 1 is a plan view showing the piezoelectric element X, while FIG. 2 is a sectional view taken along lines II—II in FIG. 1. The piezoelectric element X, including a substrate 11, a piezoelectric layer 12 and electrodes 13 and 14, is arranged to generate and receive surface acoustic waves.

The substrate 11 is rigid enough to ensure the integrity of the piezoelectric element and serves as a medium to propagate surface acoustic waves. The substrate 11 is formed of a non-piezoelectric material such as glass.

The piezoelectric layer 12 is made of a piezoelectric material, thereby exhibiting the piezoelectric effect (the generation of electric polarization as a result of the application of mechanical stress) and the reverse piezoelectric effect (the production of a mechanical distortion as a result of the application of a voltage). Examples of piezoelectric material are AlN, ZnO, and ZnO doped with Mn. The thickness h of the piezoelectric layer 12 is 1.0~3.0 μm, for example.

Figure 3:
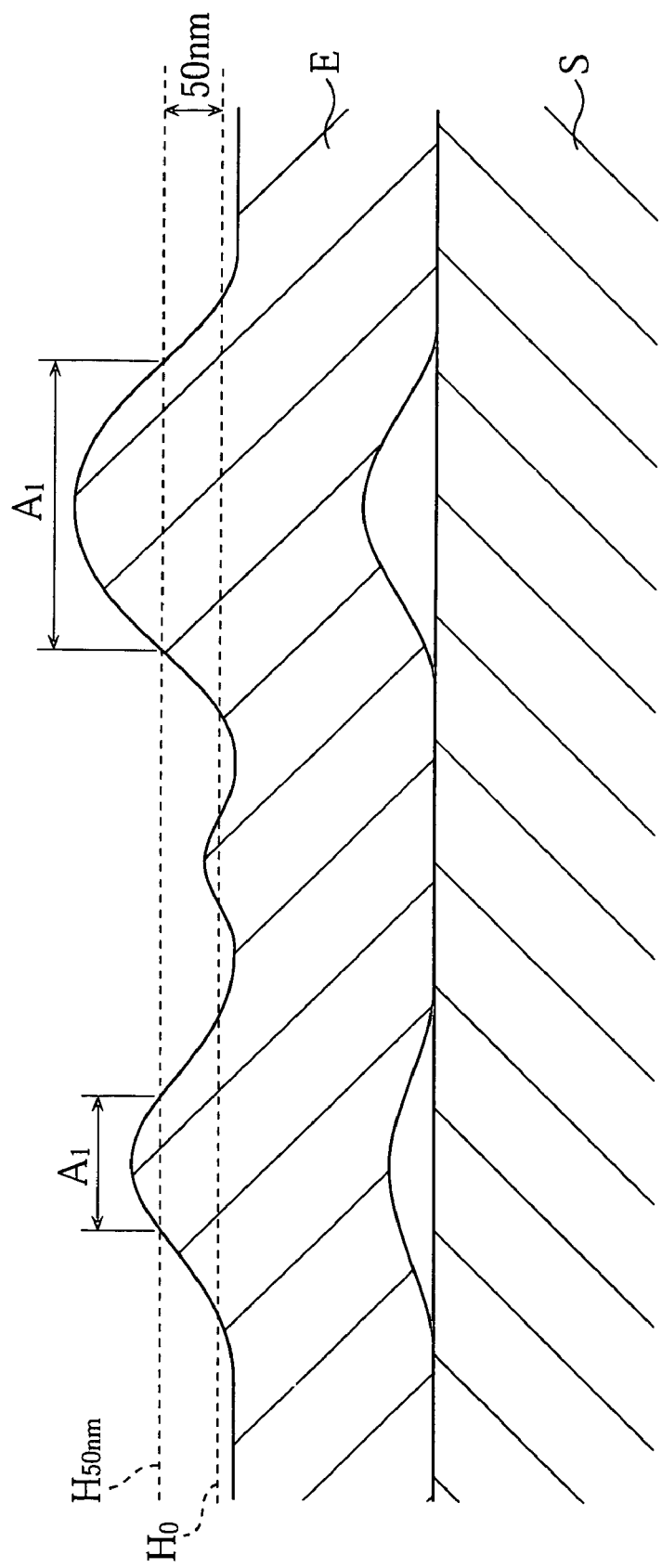
FIG. 3 is an enlarged sectional view illustrating hillocks formed in the lower electrode on the substrate.

As shown in FIG. 2, the lower electrode 13 is provided between the substrate 11 and the piezoelectric layer 12. According to the present embodiment, the "hillock occurrence rate" of the electrode 13 should be no greater than 0.1%, where the rate is defined in the following manner. Referring to FIG. 3, an electrode E is formed on a substrate S, to cover a given area $A_0$ in the surface of the substrate S. In general the electrode E is undulated, as shown in the figure, thereby having hillocks of different heights. In this situation, first, an average height H0 of the electrode surface is calculated by a known surface height calculation method, for example. Then, a height $H_{50\,nm}$ is determined, which is higher than the average height $H_0$ by 50 nanometers. Supposing that the respective hillocks in the given area are truncated by the common horizontal plane at the height H50 nm, the section of each hillock gives a cutting area $A_1$. Now, the "hillock occurrence rate" is defined as [the total of the cutting areas A1 of the respective hillocks]÷[the given area $A_0$], or simply denoted by $(\Sigma A_1)/A_0$.

As shown in FIG. 3, the above-mentioned hillock is a raised part of the electrode surface opposite to the substrate S, and it may be accompanied by a partial exfoliation of the electrode E from the substrate. The average height $H_0$ of the electrode E may be calculated by reference to the surface of the substrate S.

The hillock occurrence rate may not always be calculated over the total area $A_0$ covered with the electrode E. Practically, only a limited region (unit region) in the area $A_0$ may be selected for performing the same calculation as described above.

The electrode 13 is formed of a metal material such as aluminum alloy. Preferably, the Al alloy contains 0.1~3.0 wt % of a metal selected from the group consisting of Ti, Cr, Ni, Cu, Zn, Pd, Ag, Hf, W, Pt and Au. The Al alloy may contain two or more metals selected from the group. In this case, the concentration of each metal is in a range of 0.1~3.0 wt %. Advantageously, the electrode 13 made of such an Al alloy has a smaller thermal expansion coefficient than a counterpart electrode made of pure aluminum. Accordingly, the occurrence and growth of hillocks on the electrode 13 can be appropriately restricted to ensure 0.1% or smaller hillock occurrence rate. As shown in FIG. 1, the electrode 13 is connected to a terminal 15 having an exposed portion projecting from under the piezoelectric layer 12. The thickness of the electrode 13 is in a range of 300~600 nm, for example.

As shown in FIG. 2, the upper electrode 14 is formed on the piezoelectric layer 12. The electrode 14 has a comb-like structure having a common base 14a and a plurality of branch electrodes 14b (simply called "branches 14b"). The branches 14b extend from the base 14a and are parallel to each other. The branches 14b face the lower electrode 13 via the piezoelectric layer 12. The branches 14b illustrated in FIG. 1 are straight, but the present invention is not limited to this. For example, each branch 14b may have some bents or may be curved smoothly.

The thickness of the electrode 14 is in a range of 300~600 nm, for example. The width d1 of each branch 14b may be 40~60 μm, while the electrode pitch $\lambda_1$ of the branches 14b may be 100~150 μm. According to the present embodiment, the thickness h of the piezoelectric layer 12 and the electrode pitch $\lambda_1$ of the branches 14b are determined to satisfy the following inequality.

$$0.005 \leq h/\lambda_1 \leq 0.1$$

The upper electrode 14 is formed of a conductive material which may be the same as the one used for making the lower electrode 13. As shown in FIG. 1, the upper electrode 14 is connected to a terminal 16.

Figure 4A:
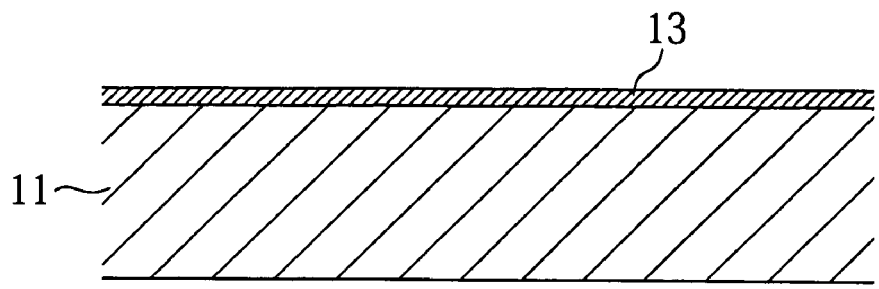
FIGS. 4A~4C illustrate a process of making the piezoelectric element shown in FIG. 1.
Figure 4B:
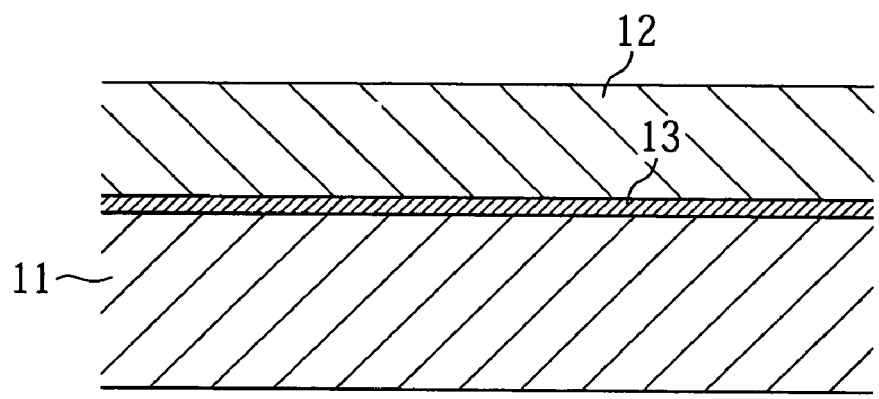
Figure 4C:
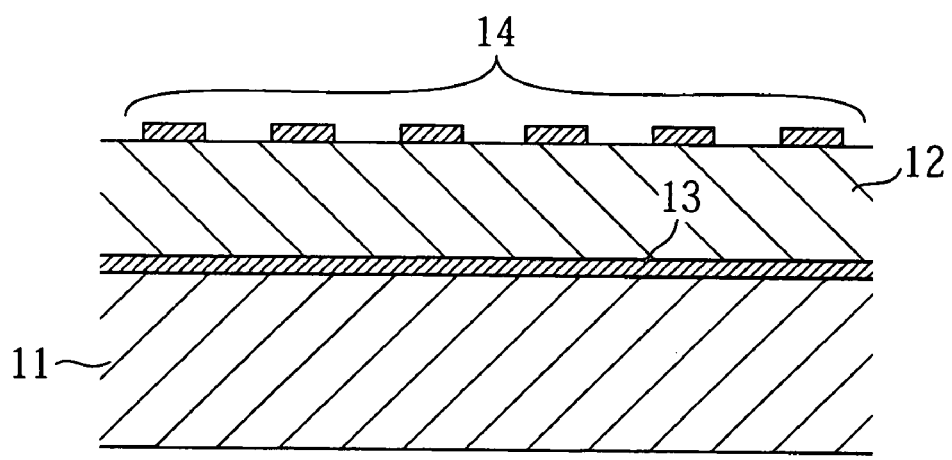

Reference is now made to FIGS. 4A-4C illustrating a process of making the piezoelectric element X. Specifically, as shown in FIG. 4A, an electrode 13, together with a terminal 15 (not shown) connected to the electrode 13, is formed on the upper surface of a substrate 11. Prior to the formation of the electrode 13 and the terminal 15, the upper surface of the substrate 11 may be subjected to detergent treatment for suppressing the occurrence of hillocks on the electrode 13 that tend to be induced in forming a piezoelectric layer to be described below. In the detergent treatment, the substrate surface is cleaned by e.g. reverse sputtering with the use of Ar plasma. For the reverse sputtering, the sputter pressure may be 0.5 Pa, the applied electric power 200 W, and the sputter time 1 minute. Through such detergent treatment, it is possible to remove dust, which can be cores or precipitants for the occurrence of hillocks on the electrode 13.

To provide the electrode 13 and the terminal 15, a metal layer is formed on the substrate 11 by sputtering or vapor deposition, for example. At this stage, the substrate 11 is heated up to a temperature between 100 and 200° C. so that the forming of the metal layer on the substrate 11 is performed in a preheated condition (the technical significance of this preheating will be described below). After the metal layer is prepared, a resist pattern is formed on the metal layer, to cover the portions of the metal layer that are turned into the electrode 13 and the terminal 15. With the resist pattern used as a mask, the metal layer on the substrate 11 is subjected to etching for removal of the uncovered portions of the metal layer. Thus, the electrode 13 and the terminal 15 are obtained.

Preferably, the surface of the resultant electrode 13 is subjected to etching by e.g. reverse sputtering with the use of Ar plasma, though the causality between this surface treatment and the advantage of the present invention still remains to be elucidated. The inventors speculate that the surface treatment may serve to remove an oxide film formed on the electrode 13, and this removal may have some positive effect on the prevention of hillocks on the electrode 13.

After the electrode 13 and the terminal 15 are completed, a piezoelectric layer 12 is formed on the substrate 11, as shown in FIG. 4B. Specifically, a piezoelectric material is applied to the substrate 11 by sputtering, to produce a piezoelectric deposition which entirely covers the upper surface of the substrate 11. Then, with a prescribed resist pattern used as a mask, the piezoelectric deposition is subjected to etching to provide the desired piezoelectric layer 12.

For the piezoelectric layer forming process, the substrate 11 is heated up to a temperature between 150~200° C. (which is lower than a typical setting temperature for performing a piezoelectric layer forming process). In this connection, it should be recalled that the substrate 11 is heated up to a temperature between 100 and 200° C. in forming the electrode 13 and terminal 15, as previously described with reference to FIG. 4A. Accordingly, the temperature difference between the former process shown in FIG. 4A and the latter process shown in FIG. 4B can be sufficiently small, specifically, no greater than 100° C. (This maximum temperature difference is determined to be on the safe side. The maximum temperature difference may be 150° C. at most) With such a precaution, it is possible to prevent or reduce the thermal expansion of the electrode 13 when the piezoelectric layer 12 is formed. As a result, the occurrence or growth of hillocks on the electrode 13 is suppressed. According to the present invention, the temperature difference adjustment described above may be replaced by or accompanied by the growth rate adjustment for the layer 12 or the pressure adjustment for the sputtering gas.

Referring to FIG. 4C, an upper electrode 14 is formed on the piezoelectric layer 12, together with a terminal 16 (not shown in the figure) connected to the electrode 14. Specifically, a conductive material is deposited on the substrate 11 and the piezoelectric layer 12 by sputtering or vapor deposition, for example. Then, a resist pattern is formed on the conductive layer to cover the portions to be turned into the electrode 14 and the terminal 16. With the resist pattern used as a mask, the conductive layer is subjected to etching. Thus, the electrode 14 and the terminal 16 are obtained.

According to the present invention, the electrode 14 and the terminal 16 may be formed by a known printing technique. Specifically, Ag paste, for example, is applied to the substrate 11 and the piezoelectric layer 12 with a prescribed mask placed thereon. Then, after the mask is removed, the applied Ag paste is sintered or annealed to evaporate the solvent contained in the paste. Thus, the electrode 14 and the terminal 16 are obtained.

The piezoelectric element X is produced in the above-described manner. As stated with reference to FIG. 4B, the formation of the piezoelectric layer 12 is performed under a condition in which the electrode 13 is prevented from undergoing occurrence or growth of hillocks. Thus, the hillock occurrence rate for the electrode 13 is no greater than 0.1%.

In the piezoelectric element X, the thickness h of the piezoelectric layer 12 and the branch pitch $\lambda_1$ of the electrode 14 are determined so that the inequality $0.005 \leq h/\lambda_1 \leq 0.1$ is satisfied. In addition, the hillock occurrence rate for the electrode 13 is no greater than 0.1%. By virtue of these two arrangements, the piezoelectric element X exhibits a higher electromechanical conversion rate than is conventionally possible.

Figure 5:
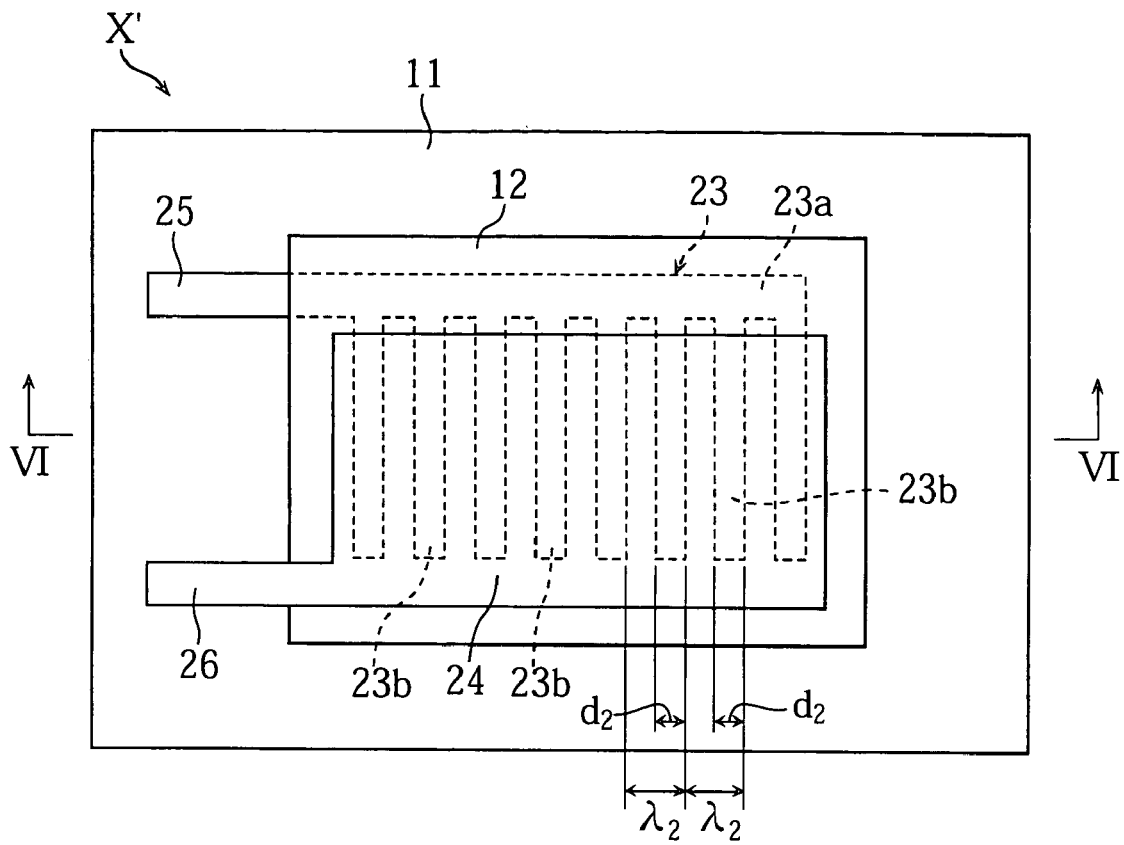
FIG. 5 is a plan view showing a piezoelectric element according to a second embodiment of the present invention.
Figure 6:
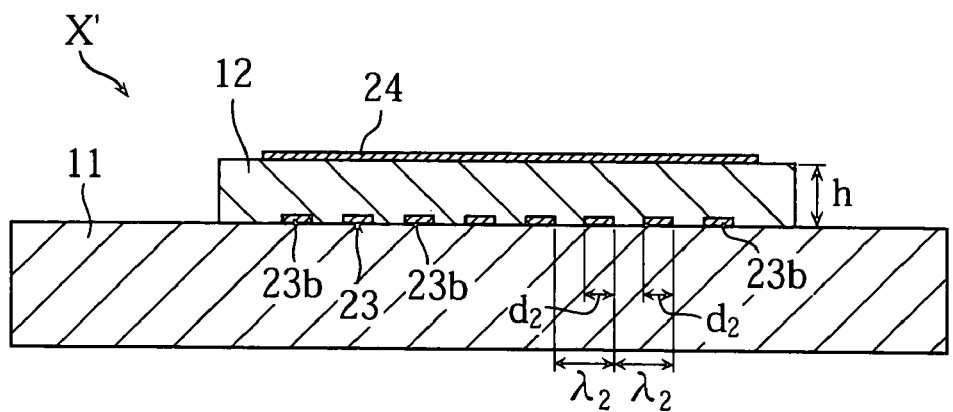
FIG. 6 is a sectional view taken along lines VI—VI in FIG. 5.

Reference is now made to FIGS. 5 and 6 illustrating a piezoelectric element x' according to a second embodiment of the present invention. FIG. 5 is a plan view showing the element X', while FIG. 6 is a sectional view taken along lines VI—VI in FIG. 5. The piezoelectric element X', including a substrate 11, a piezoelectric layer 12, a lower electrode 23 and an upper electrode 24, is designed to generate and receive surface acoustic waves. The element X' of the second embodiment differs from the element X of the first embodiment in that the element X' includes electrodes 23, 24 in place of the electrodes 13, 14. The substrate 11 and the piezoelectric layer 12 of the second embodiment are the same as those of the first embodiment described above.

The lower electrode 23, arranged between the substrate 11 and the piezoelectric layer 12, has a comb-like structure that includes a common base 23a and a plurality of branches 23b extending in parallel to each other from the base 23a. In the illustrated example, each branch 23b is straight. However, according to the present invention, they may have some bents or may be curved smoothly. The thickness of the electrode 23 is 300~600 nm, for example. The width d2 of each branch 23b may be 40~60 μm. The pitch $\lambda_2$ between the branches 23b may be 100~150 μm. The thickness h of the piezoelectric layer 12 and the branch pitch $\lambda_2$ are determined so that the inequality $0.005 \leq h/\lambda_2 \leq 0.1$ is satisfied. The electrode 23 is connected to a terminal 25 having an exposed portion projecting from under the piezoelectric layer 12.

In the second embodiment again, the hillock occurrence rate for the electrode 23 is no greater than 0.1%. The electrode 23 is formed of a metal material such as aluminum alloy. Preferably, the Al alloy contains 0.1~3.0 wt % of a metal selected from the group consisting of Ti, Cr, Ni, Cu, Zn, Pd, Ag, Hf, W, Pt and Au. Advantageously, the electrode 23 made of such an Al alloy has a smaller thermal expansion coefficient than a counterpart electrode made of pure aluminum. Accordingly, the occurrence and growth of hillocks on the electrode 23 can be appropriately restricted to ensure 0.1% or smaller hillock occurrence rate.

The upper electrode 24 is formed on the piezoelectric layer 12. The electrode 24 may be made of the same conductive material as that used for making the lower electrode 23. The thickness of the electrode 24 is 300~600 nm, for example. The electrode 24 faces the respective branches 23b of the lower electrode via the piezoelectric layer 12, and is connected to a terminal 26.

Figure 7A:
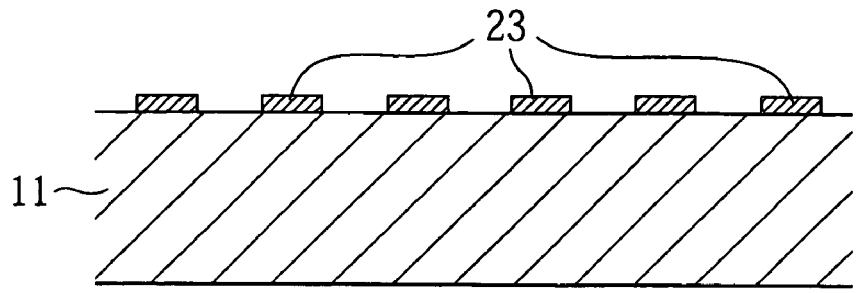
FIGS. 7A~7C illustrate a process of making the piezoelectric electrode shown in FIG. 5.
Figure 7B:
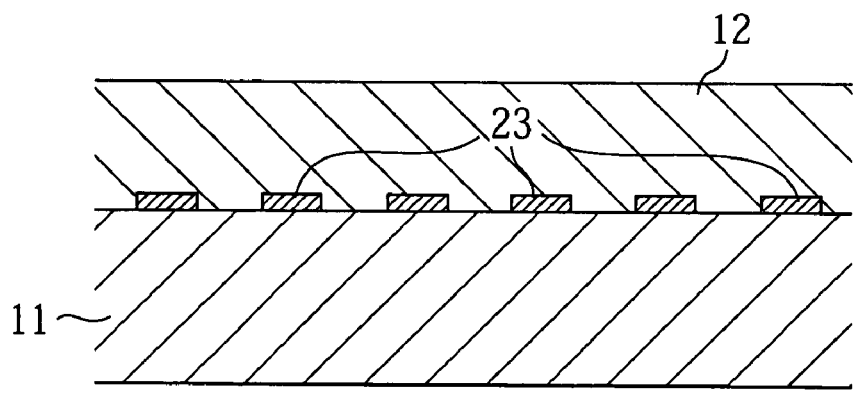
Figure 7C:
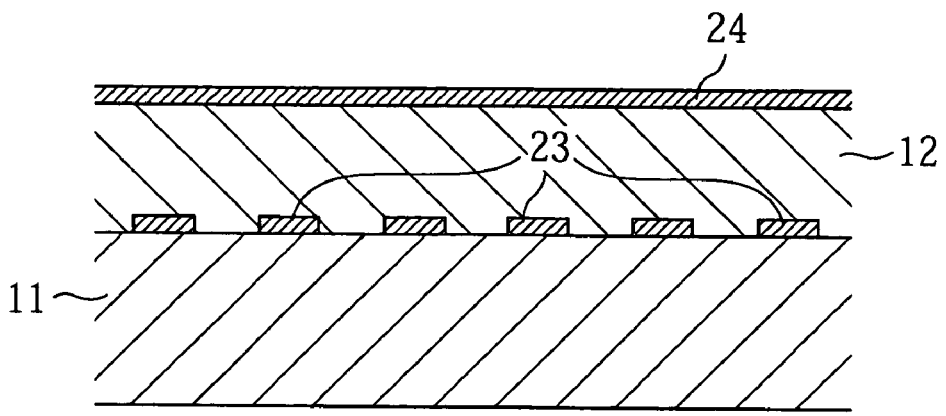

FIGS. 7A~7C show a process of making the piezoelectric element X'. Referring to FIG. 7A, a lower electrode 23 is formed on the substrate 11, together with a terminal 25 (not shown in the figure) connected to the electrode 23. As in the first embodiment, preferably the substrate 11 may be subjected to surface cleaning prior to the formation of the electrode 23 and the terminal 25, so that the hillock occurrence on the electrode 23 is suppressed in forming a piezoelectric layer to be described below.

In forming the electrode 23 and the terminal 25, a conductive metal material is deposited on the substrate 11 by sputtering or vapor deposition, for example. At this stage, the substrate 11 is heated up to a prescribed temperature, as performed in the first embodiment, for the purposes of preventing the occurrence of hillocks on the electrode 23. Then, a resist pattern is formed on the conductive layer for covering the portions to be turned into the electrode 23 and the terminal 25. With the resist pattern used as a mask, the conductive layer is subjected to etching. Thus, the electrode 25 and the terminal 25 are produced on the substrate 11. Preferably, the resultant electrode 23 is subjected to surface etching by reverse sputtering, for example.

Then, as shown in FIG. 7B, a piezoelectric layer 12 is formed on the substrate 11. Specifically, a piezoelectric material is deposited on the substrate 11 by sputtering. Then, with a prescribed resist pattern used as a mask, the piezoelectric deposition is subjected to etching, to produce the desired piezoelectric layer 12. In forming the piezoelectric layer 12, the substrate 11 is heated up to a prescribed temperature, as performed in the first embodiment, for preventing the occurrence of hillocks on the electrode 23.

Referring to FIG. 7C, an upper electrode 24 is formed on the piezoelectric layer 12, together with a terminal 26 (not shown in the figure) connected to the electrode 24. The electrode 24 and the terminal 26 may be produced in the same manner as described with respect to the electrode 14 and the terminal 16 of the first embodiment.

The piezoelectric element X' produced in the above-described manner can enjoy the same advantage as the piezoelectric element X of the first embodiment. Specifically, the hillock occurrence rate for the electrode 23 can be no greater than 0.1%.

In the piezoelectric element X', the thickness h of the piezoelectric layer 12 and the branch pitch $\lambda_2$ of the electrode 23 are determined so that the inequality $0.005 \leq h/\lambda_2 = \leq 0.1$ is satisfied. In addition, the hillock occurrence rate for the electrode 23 is no greater than 0.1%. By virtue of these two arrangements, the piezoelectric element X' exhibits a higher electromechanical conversion rate than is conventionally possible.

Figure 8:
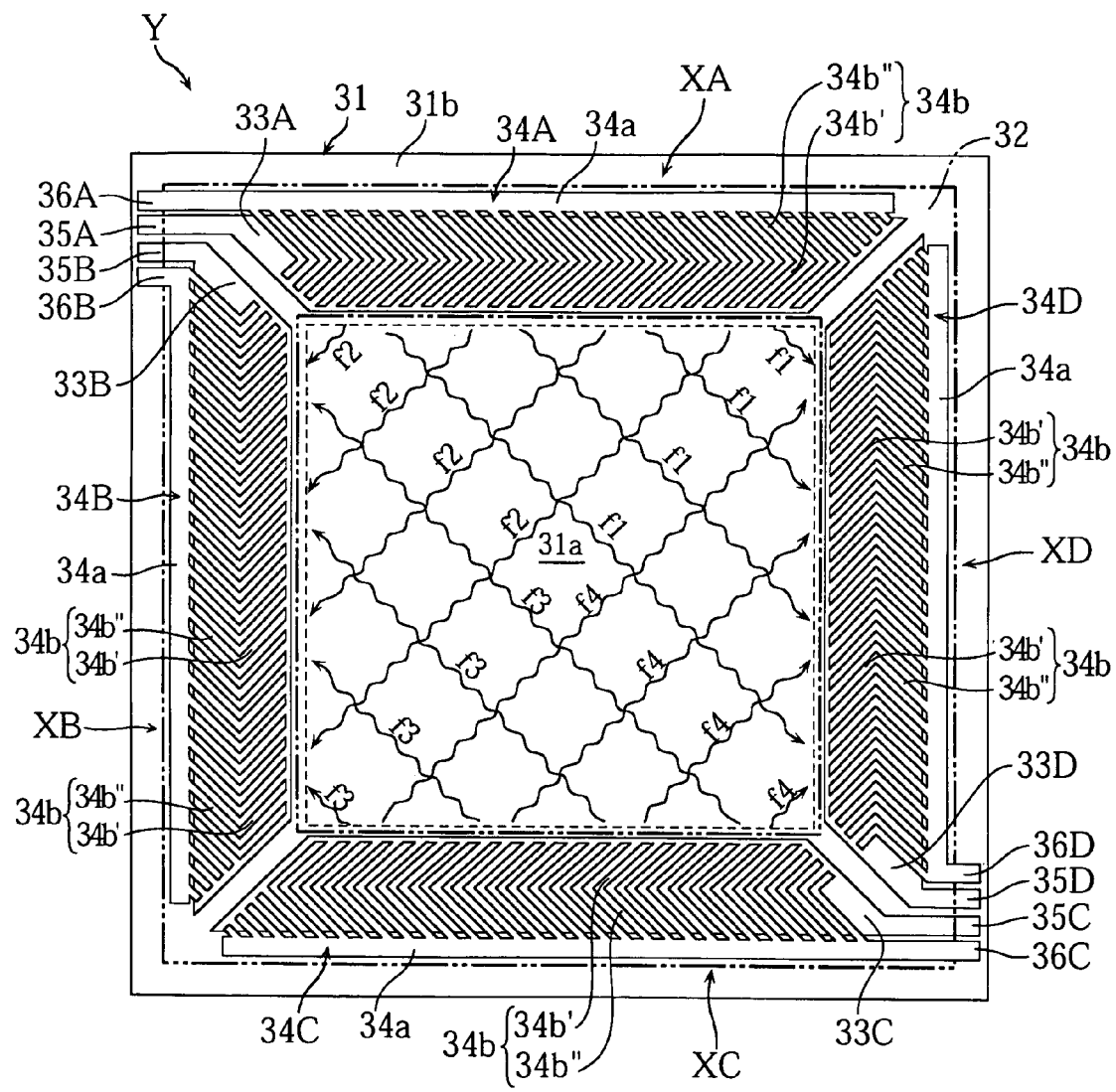
FIG. 8 is a plan view showing a touch screen according to a third embodiment of the present invention.
Figure 9:
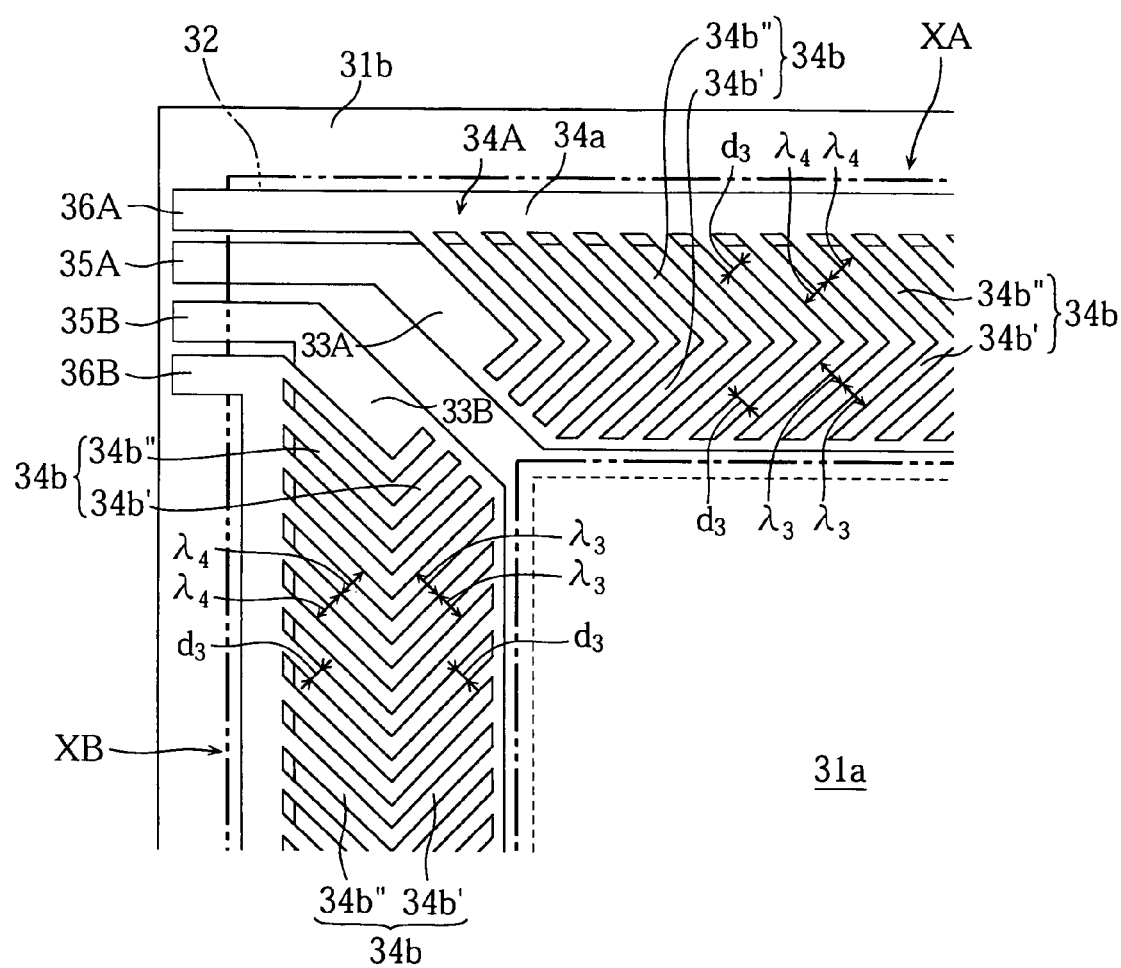
FIG. 9 is an enlarged view showing a part of the touch screen shown in FIG. 8.

Reference is now made to FIGS. 8 and 9 illustrating a SAW touch screen Y according to a third embodiment of the present invention. The touch screen Y includes a substrate 31, a piezoelectric layer 32, lower electrodes 33A~33D and upper electrodes 34A~34D. For clarity of illustration, the piezoelectric layer 32 is depicted in double-dot chain lines.

The substrate 31 is a transparent plate through which surface acoustic waves propagate. The substrate 31 includes a detection region 31a and a marginal region 31b. In the figures, the boundary between the detection region 31a and the marginal region 31b is indicated by broken lines. The substrate 31 is made of a non-piezoelectric material such as glass and has a thickness of 0.7~1.1 mm. In the illustrated example, the detection region 31a is rectangular (precisely, square), though the present invention is not limited to this. The detection region 31a is surrounded by the marginal region 31b, in which wave generators and wave receivers (to be described below) are provided.

The piezoelectric layer 32 is provided on the marginal region 31b, but not on the detection region 31a. The layer 32 is formed of a piezoelectric material as the piezoelectric layer 12 of the first embodiment, thereby exhibiting the piezoelectric effect and the reverse piezoelectric effect. The thickness h of the piezoelectric layer 32 is 1.0~3.0 μm, for example.

The lower electrodes 33A~33D are provided between the substrate 31 and the piezoelectric layer 32, and have a hillock occurrence rate of no greater than 0.1%. The electrodes 33A~33D are formed of a metal material such as an aluminum alloy that contains 0.1~3.0 wt % of a metal selected from the group consisting of Ti, Cr, Ni, Cu, Zn, Pd, Ag, Hf, W, Pt and Au. The thickness of each electrode 33A~33D is 300~600 nm, for example. The electrodes 33A~33D are connected to terminals 35A~35D, respectively. As seen from FIG. 8, each of the terminals 35A~35D has an exposed portion projecting from under the piezoelectric layer 32.

Each of the upper electrodes 34A~34D, provided on the piezoelectric layer 32, has a comb-like structure that includes a common base 34a and a plurality of branches 34b extending from the base 34a. As shown in FIG. 8, most of the branches 34b, which are relatively long, have a bent, whereas the remaining branches 34b, which are relatively short, are straight along their entire length.

Each of the relatively long branches 34b can be divided at its bent into two locally straight portions: an inner portion 34b' (closer to the detection region 31a) and an outer portion 34b" (farther from the detection region 31a). The inner portion 34b' is angled at a prescribed degree with respect to the outer portion 34b", so that the two portions 34b', 34b" extend in different directions. The angle to be made between the inner and the outer portions may depend on the ratio of the two lengths of the adjacent sides defining the rectangular detection region 31a. In the example illustrated in FIGS. 8 and 9, the detection region 31a is a square, meaning that the ratio of the length of one side (vertical side, for example) to the length of the adjacent side (horizontal side) is 1:1. In this case, the angle between the inner and the outer portions 34b', 34b" is 90°. The branches 34b face the electrode 33A~33D via the piezoelectric layer 32.

The thickness of the electrode 34 is 300~600 nm, for example. Referring to FIG. 9, the width d3 of each branch 34b is 40~60 μm, for example. Both the pitch $\lambda_3$ between the inner portions 34b' of the branches 34b and the pitch $\lambda_4$ between the outer portions 34b" are 100~150 μm, for example, as in the above-mentioned branch pitch $\lambda_1$. In each electrode 34, the pitches $\lambda_3$ and $\lambda_4$ may be the same or different from each other, depending on the operating manner of the touch screen Y. For any two of the electrodes 34A~34D, the pitch $\lambda_3$ and/or the pitch $\lambda_4$ of one electrode may be the same or different from the pitch $\lambda_3$ and/or the pitch $\lambda h_4$ of the other electrode, depending on the operating manner of the touch screen Y. The thickness h of the piezoelectric layer 32 and the branch pitch $\lambda_3$ are determined to satisfy the inequality $0.005 \leq h/\lambda_3 \leq 0.1$. Likewise, the thickness h of the piezoelectric layer 32 and the branch pitch $\lambda_4$ are determined to satisfy the same inequality $0.005 \leq h/\lambda_4 \leq 0.1$.

The electrodes 34A~34D are made of a conductive material which may be the same as the one used for making the electrodes 33A~33D. As shown in FIG. 8, the electrodes 34A~34D are connected to terminals 36A~36D, respectively.

The touch screen Y includes four piezoelectric elements X(XA~XD) produced in accordance with the first embodiment of the present invention. The piezoelectric elements XA~XD are arranged in the marginal region 31b of the substrate 31. As seen from the comparison between FIG. 8 and FIG. 1, the paired electrodes 33A–34A (and 33B–34B, 33C–34C, 33D–34D as well) correspond to the paired electrodes 13–14 of the piezoelectric element X, the piezoelectric layer 32 to the piezoelectric layer 12, and the substrate 31 to the substrate 11. Further, the terminal 35A–35D and the terminal 36A–36D correspond to the terminal 15 and the terminal 16, respectively. The touch screen Y with four piezoelectric elements X may be produced in the same procedure as that described above with reference to FIGS. 4A~4C.

In operation of the touch screen Y, two facing piezoelectric elements XA and XC, for example, are energized intermittently, only one at a time.

For the piezoelectric element XA, an alternating voltage is applied across the electrodes 33A and 34A via the terminals 35A and 36A for generation of waves. Upon application of the voltage, as shown in FIG. 8, two kinds of surface acoustic waves f1 and f2 of prescribed frequencies are produced by the element XA. The waves f1 propagate in a first direction perpendicular to the inner portions 34b' of the branches 34b, while the waves f2 propagate in a second direction perpendicular to the outer portions 34b" of the branches 34b.

After propagating through the detection region 31a of the substrate 31, the wave f1 is received by the inner portions 34b' of the piezoelectric element XD. As a result, a wave detection signal is outputted from the element XD via the terminals 35D and 36D. Specifically, referring to FIG. 8, the output of the signal begins upon reception of the wave f1 by the uppermost inner portion 34b' of the element XD, and continues until the lowermost inner portion 34b' of the element XD has completed the reception of the wave f1.

Turning now to the wave f2, it is received by the outer portions 34b" of the piezoelectric element XB after propagating through the detection region 31a of the substrate 31. As a result, a wave detection signal is outputted from the element XB via the terminals 35B and 36B. Specifically, referring to FIG. 8, the output of the signal begins upon reception of the wave f2 by the uppermost outer portion 34b" of the element XB, and continues until the lowermost outer portion 34b" of the element XB has completed the reception of the wave f2.

Similarly to the above-described piezoelectric element XA, the piezoelectric element XC is energized to operate in the following manner. First, an alternating voltage is applied across the electrodes 33C and 34C via the terminals 35C and 36C for generation of waves. Upon application of the voltage, two kinds of surface acoustic waves f3 and f4 are produced by the element XC. The waves f3 propagate in a third direction perpendicular to the inner portions 34b' of the branches 34b, while the waves f4 propagate in a fourth direction perpendicular to the outer portions 34b" of the branches 34b. The piezoelectric element XC is energized immediately after the output process of the wave detection signals from the elements XB, XD has been completed.

After propagating through the detection region 31a of the substrate 31, the wave f3 is received by the inner portions 34b' of the piezoelectric element XB. As a result, a wave detection signal is outputted from the element XB via the terminals 35B, 36B. Referring to FIG. 8, the output of the signal begins upon reception of the wave f3 by the lowermost inner portion 34b' of the element XB, and continues until the uppermost inner portion 34b' of the element XB has completed the reception of the wave f3.

The wave f4, after propagating through the detection region 31a of the substrate 31, is received by the outer portions 34b" of the piezoelectric element XD. As a result, a wave detection signal is outputted from the element XD via the terminals 35D, 36D. The output of the signal begins upon reception of the wave f4 by the lowermost outer portion 34b" of the element XD, and continues until the uppermost outer portion 34b" of the element XD has completed the reception of the wave f4.

While the touch screen Y is operating, the above-described series of processes (i.e., from the generation of waves f1, f2 by the element XA to the output of wave detection signals from the elements XB, XD based on the reception of the waves f3, f4) are performed repeatedly.

When an area of the detection region 31a of the touch screen Y in operation is touched with a finger, for example, the waves f1~f4 undergo amplitude reduction when passing the touched area. Due to the reduced amplitude of the surface acoustic waves, the wave detection signals from the elements XB, XD have a lower output level. Thus, it is possible to locate the touched area in the detection region 31a by analyzing the timing of the level reduction detected in the wave detection signals.

In the above-described touch screen Y, the piezoelectric elements XB, XD may be used as a wave generator, and the remaining elements XA, XC as a wave receiver.

The touch screen Y includes piezoelectric elements X having a high electro-mechanical conversion rate as a wave generator or wave receiver. Thus, the touch screen Y of the present invention needs a lower driving voltage than the conventional touch screens. The touch screen Y can also provide a greater detection accuracy than is conventionally possible.

Figure 10:
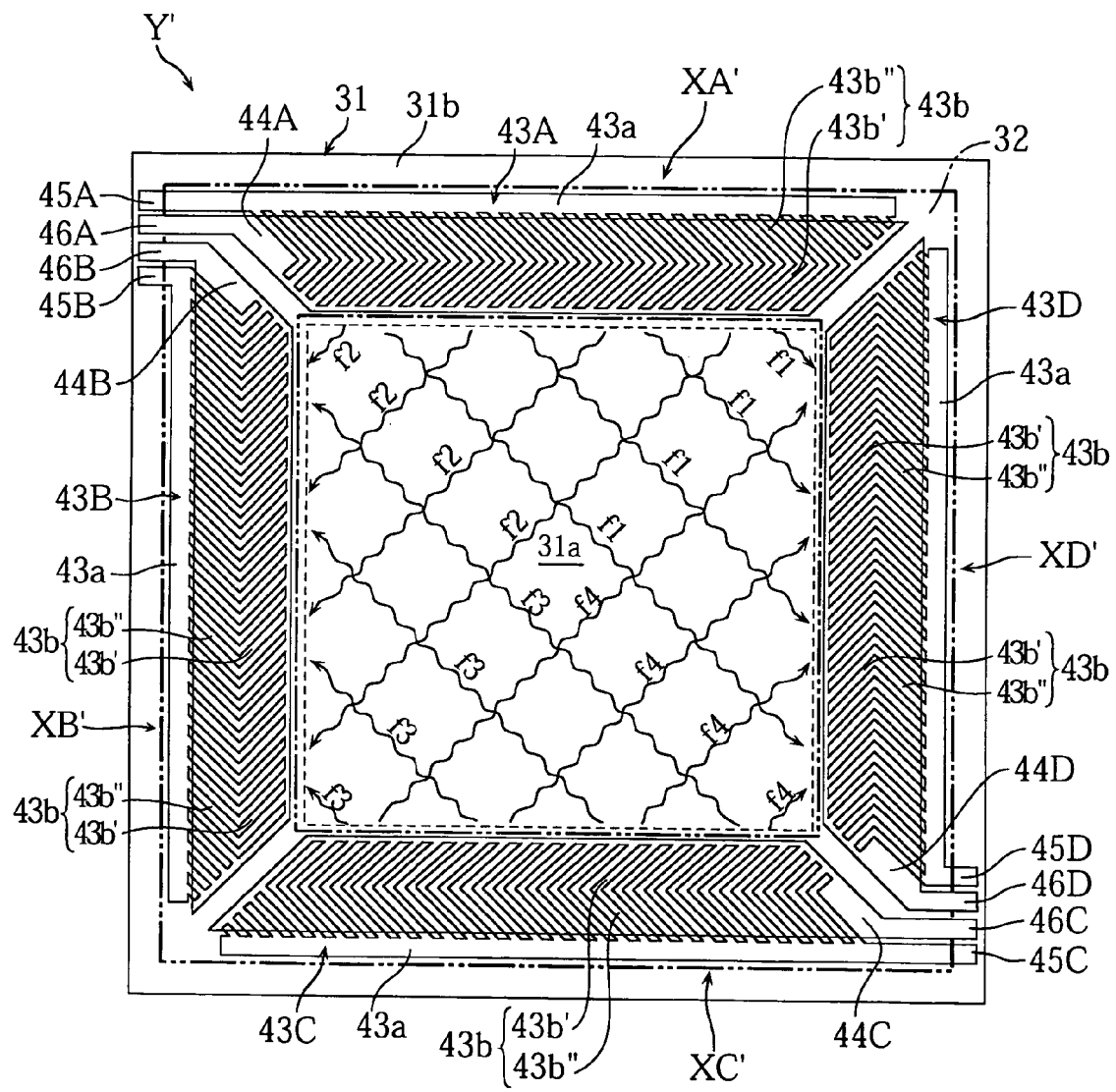
FIG. 10 is a plan view showing a touch screen according to a fourth embodiment of the present invention.
Figure 11:
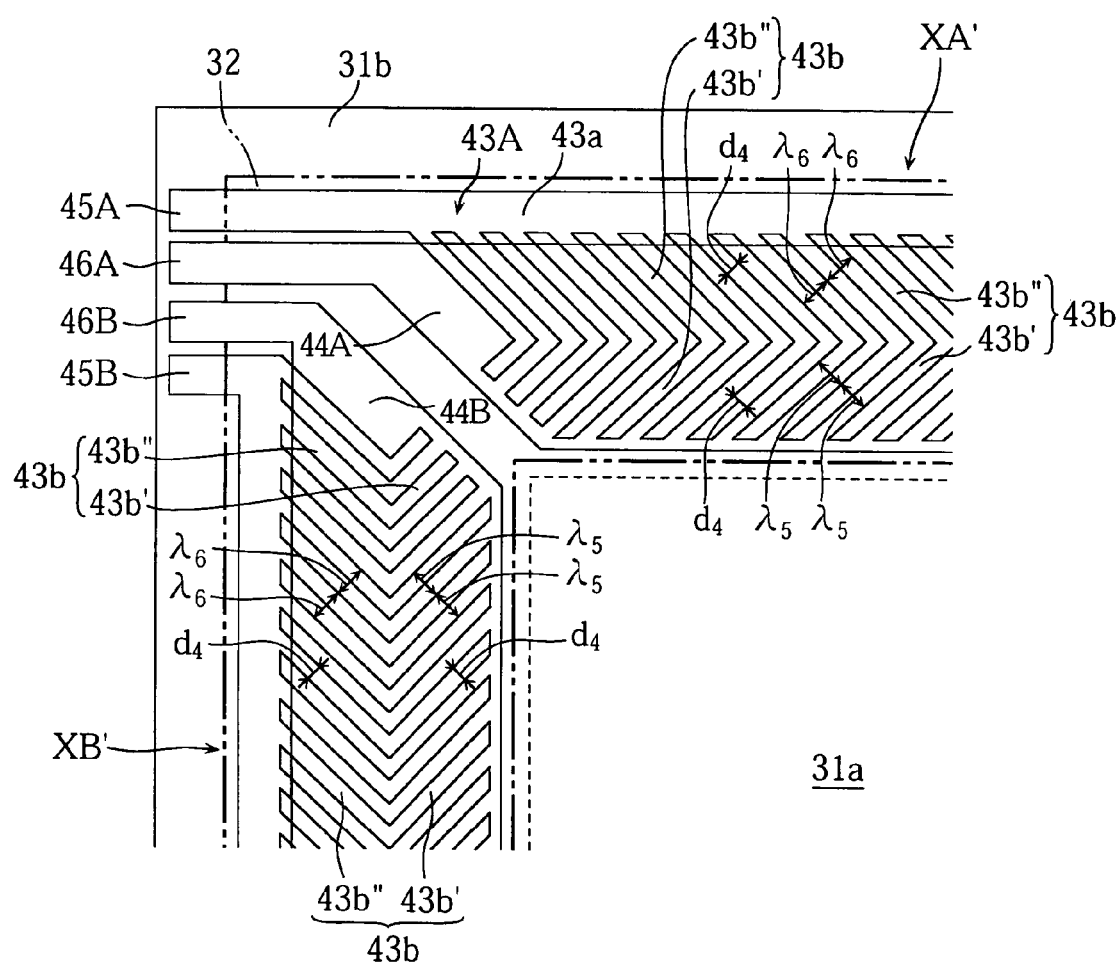
FIG. 11 is an enlarged view showing a part of the touch screen shown in FIG. 10.

FIGS. 10 and 11 show a touch screen Y' according to a fourth embodiment of the present invention. The touch screen Y' is a SAW touch screen including a substrate 31, a piezoelectric layer 32, lower electrodes 43A~43D and upper electrodes 44A~44D. The touch screen Y' differs from the above-described touch screen Y in that electrodes 43A~43D and 44A~44D are used in place of the electrodes 33A~33D and 34A~34D. However, the substrate 31 and the piezoelectric layer 32 of the touch screen Y' are the same as those used for the touch screen Y.

The lower electrodes 43A~43D are arranged between the substrate 31 and the piezoelectric layer 32. Each of these electrodes has a comb-like structure that includes a common base 43a and a plurality of branches 43b extending from the base 43a. As shown in FIG. 10, most of the branches 43b, which are relatively long, have a bent, whereas the remaining branches 43b, which are relatively short, are straight along their entire length.

Each of the relatively long branches 43b can be divided at its bent into two locally straight portions: an inner portion 43b' (closer to the detection region 31a) and an outer portion 43b" (farther from the detection region 31a). The inner portion 43b' is angled at a prescribed degree with respect to the outer portion 43b", so that the two portions 43b', 43b" extend in different directions. The angle to be made between the inner and the outer portions may depend on the ratio of the two lengths of the adjacent sides defining the rectangular detection region 31a. In the example illustrated in FIGS. 10 and 11, the detection region 31a is a square, meaning that the ratio of the length of one side (vertical side, for example) to the length of the adjacent side (horizontal side) is 1:1. In this case, the angle between the inner and the outer portions 43b', 43b" is 90°.

The thickness of the electrode 43 is 300~600 nm, for example. Referring to FIG. 11, the width d4 of each branch 43b is 40~60 μm, for example. Both the pitch $\lambda_5$ between the inner portions 43b' of the branches 43b and the pitch $\lambda_6$ between the outer portions 43b" are 100~150 μm, for example, as in the above-mentioned branch pitch $\lambda_2$. In each electrode 43, the pitches $\lambda_5$ and $\lambda_6$ may be the same or different from each other, depending on the operating manner of the touch screen Y'. For any two of the electrodes 43A~43D, the pitch $\lambda_5$ and/or the pitch $\lambda_6$ of one electrode may be the same or different from the pitch $\lambda_5$ and/or the pitch $\lambda_6$ of the other electrode, depending on the operating manner of the touch screen Y'. The thickness h of the piezoelectric layer 32 and the branch pitch $\lambda_5$ are determined to satisfy the inequality $0.005 \leq h/\lambda_5 \leq 0.1$, Likewise, the thickness h of the piezoelectric layer 32 and the branch pitch $\lambda_6$ are determined to satisfy the same inequality $0.005 \leq h/\lambda_6 \leq 0.1$.

The hillock occurrence rate for the lower electrodes 43A~43D is no greater than 0.1%. The electrodes 43A~43D may be formed of an aluminum alloy that contains 0.1~3.0 wt % of a metal selected from the group consisting of Ti, Cr, Ni, Cu, Zn, Pd, Ag, Hf, W, Pt and Au. The thickness of the electrodes 43A~43D is 300~600 nm, for example. The electrodes 43A~43D are connected to terminals 45A~45D, respectively. Each of the terminals 45A~45D has an exposed portion extending from under the piezoelectric layer 32.

The upper electrodes 44A~44D are provided on the piezoelectric layer 32, and formed of a conductive material which may be the same as that used for making the lower electrodes 43A~43D. The thickness of the electrodes 44A~44D is 300~600 nm, for example. The electrodes 44A~44D face the branches 43b of the lower electrodes via the piezoelectric layer 32. The electrodes 44A~44D are connected to terminals 46A~46D, respectively.

The touch screen Y' includes four piezoelectric elements X' (XA'~D') according to the second embodiment, which are disposed in the marginal region 31b of the substrate 31. The paired electrodes 43A–44A (and 43B–44B, 43C–44C, 43D–44D as well) correspond to the paired electrodes 23–24 of the piezoelectric element X', the piezoelectric layer 32 to the piezoelectric layer 12, and the substrate 31 to the substrate 11. Further, the terminal 45A–45D and the terminal 46A–46D correspond to the terminal 25 and the terminal 26, respectively. The touch screen Y' with four piezoelectric elements X' may be produced in the same procedure as that described above with reference to FIGS. 7A~7C.

In operating the touch screen Y', the pair of the piezoelectric elements XA' and XC' may be worked as a wave generator, while the other pair of the piezoelectric elements XB' and XD' as a wave receiver. It is possible to exchange the functions of these two pairs. The workings of the wave generators and receivers of the touch screen Y' are the same as those described with respect to the touch screen Y.

The touch screen Y' includes piezoelectric elements X' having a high electromechanical conversion rate as a wave generator or wave receiver. Thus, the touch screen Y' of the present invention needs a lower driving voltage than the conventional touch screens. The touch screen Y' can also provide a greater detection accuracy than is conventionally possible.

[Exemplary Device 1]

<Production of SAW Filters>

Figure 12:
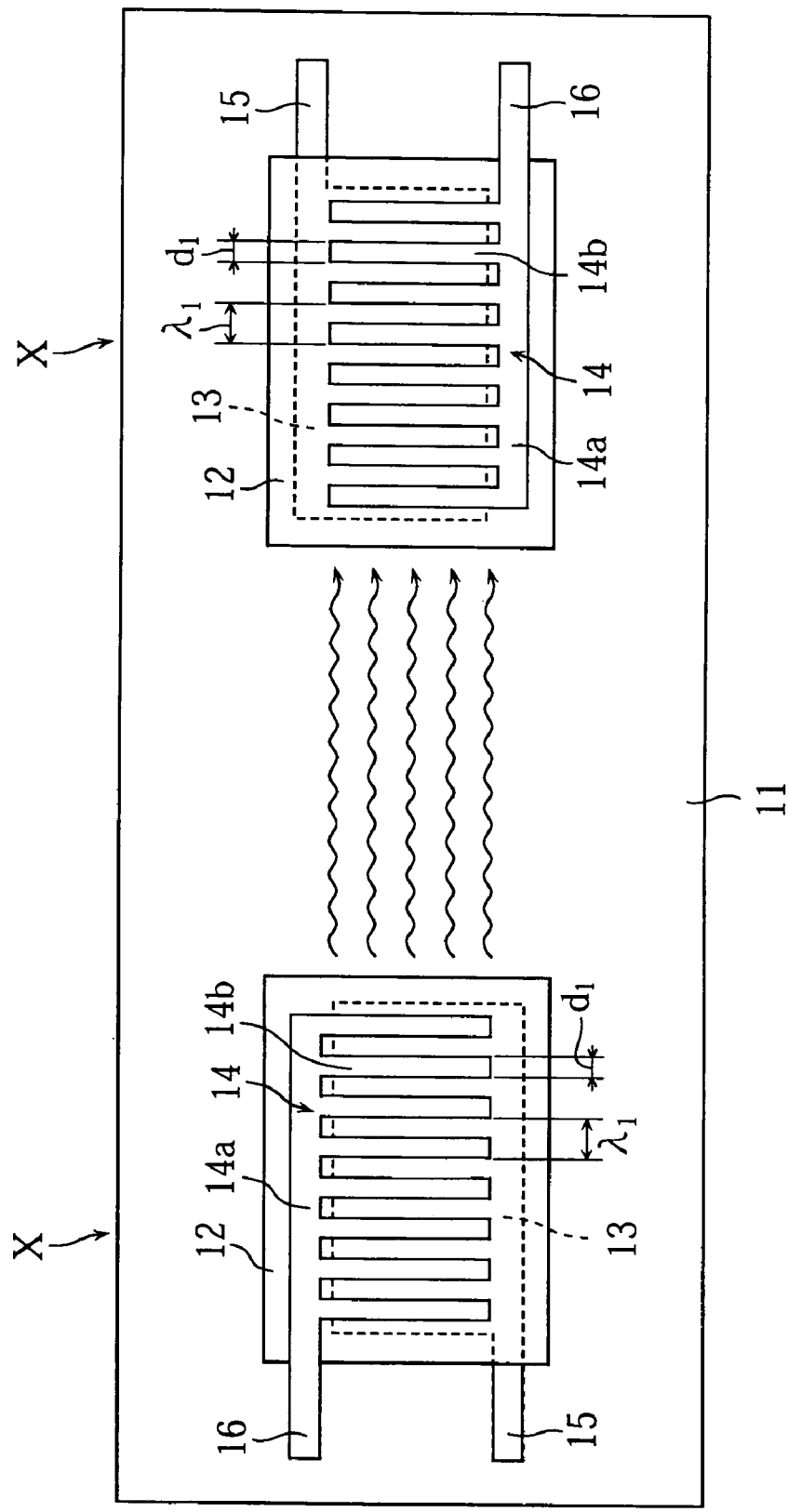
FIG. 12 is a plan view showing a SAW filter including piezoelectric elements of FIG. 1.

Referring to FIG. 12, a transversal SAW filter was produced with the use of two piezoelectric elements X of the first embodiment. As shown in the figure, the piezoelectric elements X are arranged in a normally facing position.

To make the filter X, first, an Al-alloy layer (300 nm in thickness) was formed on a glass substrate 11 by sputtering (First Layer Forming Step). The aluminum alloy used for this step contained 2.0 wt % of copper (Cu). In the sputtering, use was made of an Al-alloy target containing 2.0 wt % of Cu. The sputter gas was argon (Ar) and had a pressure of 0.5 Pa. The discharge power was 1 kW. Then, the Al-alloy layer was subjected to etching, with a prescribed resist pattern used as a mask. As a result, two facing electrodes 13 and terminals 15 were formed on the substrate 11. The resultant electrodes 13 was subjected to surface etching treatment by reverse sputtering with the use of Ar plasma.

Then, a ZnO layer (piezoelectric layer) with a thickness of 2.2 μm was formed on the substrate 11 by reactive sputtering (Second Layer Forming Step). Specifically, in forming the ZnO layer, use was made of a sintered ZnO target, and Ar and $O_2$ gases were utilized for the sputtering gas. The flow ratio of the Ar gas to the $O_2$ gas was 4:1. The sputtering gas had a pressure of 0.3 Pa, and the discharge power was 3 kW. During the second layer forming step, the substrate 11 was heated so that it was kept at 300° C. The layer forming process continued for 20 minutes. Thereafter, the resultant ZnO layer was subjected to etching, with a prescribed resist pattern used as a mask, whereby the desired piezoelectric layer 12 was produced.

Then, an Al-alloy layer (300 nm in thickness) was formed on the substrate 11 and the piezoelectric layer 12 by sputtering (Third Layer Forming Step). In the sputtering, uses was made of an Al-alloy target containing 2.0 wt % of Cu. The sputtering gas was Ar, and had a pressure of 0.5 Pa. The discharge power was 1 kW. The resultant Al-alloy layer was subjected to etching, with a prescribed resist pattern used as a mask. Thus, the electrodes 14 and the terminals 16 were obtained. As shown in FIG. 12, each electrode 14 includes a common base 14a and a number of parallel branches 14b extending from the base 14a. The width d1 of each branch 14b is 44 μm, and the pitch $\lambda_1$ between the branches 14b is 100 μm.

In accordance with the above procedure, a prescribed number of filters as shown in FIG. 12 were produced. In each filter, the thickness h of the piezoelectric layer 12 and the branch pitch $\lambda_1$ were determined to satisfy the inequality $0.005 \leq h/\lambda_1 \leq 0.1$.

<Measurement of Hillock Occurrence Rate>

The hillock occurrence rate was measured with respect to samples each produced in the following manner. First, an Al-alloy layer (containing 2.0 wt % of Cu and having a thickness of 300 nm) was formed on a glass substrate under the same condition as that described above with respect to the first layer forming step. Then, the glass substrate with the Al-alloy layer formed thereon was subjected to heating treatment by which the substrate was heated at 300° C. for 20 minutes. It should be noted here that these heating temperature and time are the same as the above-mentioned heating temperature and time adopted for the second layer forming step. In this manner, substantially the same conditions for the occurrence and growth of hillocks in the SAW filers are realized in the samples. The obtained samples were subjected to inspection, whereby the surfaces of the Al-alloy layers of the respective samples were examined by an atomic force microscope (AFM) for determination of the hillock occurrence rate. The result was that the hillock occurrence rate for the Al-alloy layer of the samples was 0.01%. This implies that the hillock occurrence rate for the electrode 13 of the piezoelectric element X (FIG. 12) was also 0.01%.

<Measurement of Insertion Loss>

With respect to the SAW filters shown in FIG. 12, the insertion loss between the input signal and the output signal was measured. The result was that the insertion loss of the filter was −12 dB, which is plotted in a graph shown in FIG. 13 (see ED1). The abscissa of the graph represents hillock occurrence rate (logarithmic scale), while the ordinate represents insertion loss (dB).

[Exemplary Device 2]

SAW filters were produced in the same procedure as that described above with respect to Exemplary Device 1, except that the Al-alloy layer of Device 2 produced in the first layer forming step was made to contain 1.0 wt % of Cu (note that the counterpart layer of Device 1 contained 2.0 wt % of Cu). Consequently, the electrode 13 of Device 2 was formed of an Al-alloy containing 1.0 wt % of Cu. In the filter of Device 2, the thickness h of the piezoelectric layer 12 was 2.2 μm, and the branch pitch $\lambda_1$ was 100 μm. Thus, the inequality $0.005 \leq h/\lambda_1 \leq 0.1$ was satisfied (in the present case, $h/\lambda_1 = 2.2/110 = 0.02$). For Exemplary Device 2, the hillock occurrence rate was 0.009%, and the insertion loss was −11 dB. The results are plotted in the graph of FIG. 13 (see ED2).

[Comparative Devices 1~3]

Comparative SAW filters 1~3 were produced in the same procedure as that described above with respect to Exemplary Device 1, except that the Al-alloy layer of Device 1 produced in the first layer forming step was replaced with a pure aluminum layer (comparative filter 1), an Al-alloy layer containing 1.0 wt % of Si (comparative filter 2), or an Al-alloy layer containing 0.5 wt % of Si (comparative filter 3). In each of the comparative filters 13, the thickness h of the piezoelectric layer was 2.2 μm, and the branch pitch X was 100 μm (thus, the inequality $0.005 \leq h/\lambda \leq 0.1$ was satisfied). The hillock occurrence rates for the electrodes between the glass substrate and the piezoelectric layer were 30% (comparative filter 1), 0.3% (comparative filter 2), and 0.7% (comparative filter 3). The insertion losses were −50 dB (comparative filter 1), −42 dB (comparative filter 2), and −48 dB (comparative filter 3). These measurements are plotted in the graph of FIG. 13 (see CD1~CD3).

[Evaluation of Exemplary Devices]

Figure 13:
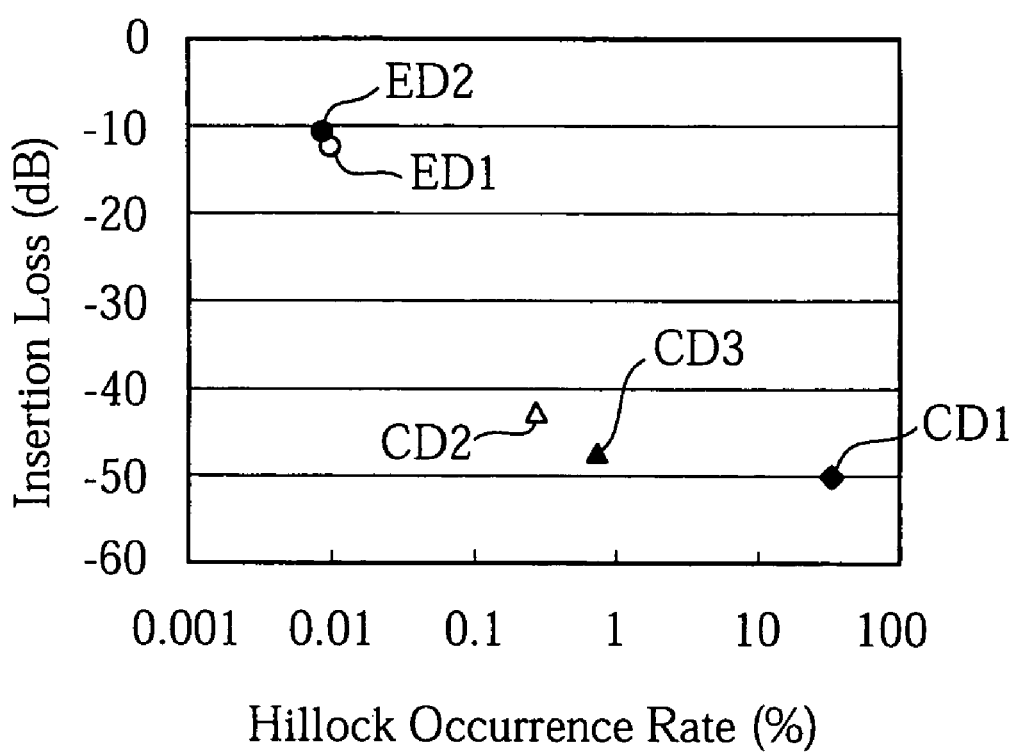
FIG. 13 is a graph showing the relation between the insertion loss and the hillock occurrence rate for Exemplary Devices 1~2 and Comparative Devices 1~3.

As shown in FIG. 13, the exemplary filters 1 and 2 (the hillock occurrence rate ≦ 0.1%) have a lower insertion loss than the comparative filters 1~3 (the hillock occurrence rate ≦ 0.1%). The inventors speculate that the lower insertion loss in each exemplary filter is due to a relatively high electromechanical conversion rate which results from the lower hillock occurrence rate.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A touch screen comprising:
   a substrate including a detection region and a marginal region surrounding the detection region;
   a wave generator arranged in the marginal region for generating a surface acoustic wave in the substrate; and
   a wave receiver arranged in the marginal region for receiving the surface acoustic wave;
   each of the wave generator and the wave receiver comprising:
   a piezoelectric layer having a first surface facing the substrate and a second surface opposite to the first surface, the piezoelectric layer having a thickness h;
   a first electrode arranged between the substrate and the first surface of the piezoelectric layer; and
   a second electrode held in contact with the second surface of the piezoelectric layer;
   wherein one of the first electrode and the second electrode includes a common base and a plurality of parallel branches extending from the base, the branches being spaced from each other by a pitch λ, the other of the first electrode and the second electrode including a portion that faces the branches via the piezoelectric layer,
   wherein the thickness h and the pitch λ are determined to satisfy an inequality $0.005 \leq h/\lambda \leq 0.1$, wherein the first electrode has a hillock occurrence rate which is no greater than 0.1%.

2. The touch screen according to claim 1, wherein the common base and the branches belong to the first electrode.

3. The touch screen according to claim 1, wherein the first electrode is formed of an aluminum alloy containing 0.1~3.0 wt % of a metal selected from a group consisting of Ti, Cr, Ni, Cu, Zn, Pd, Ag, Hf, W, Pt and Au.

4. The touch screen according to claim 3, wherein the piezoelectric layer is formed of ZnO doped with Mn.

5. A piezoelectric element comprising:
a substrate;
a piezoelectric layer having a first surface and a second surface opposite to the first surface, the first surface facing the substrate, the piezoelectric layer having a thickness h;
a first electrode arranged between the substrate and the first surface of the piezoelectric layer; and
a second electrode held in contact with the second surface of the piezoelectric layer;
wherein one of the first electrode and the second electrode includes a common base and a plurality of parallel branches extending from the base, the branches being spaced from each other by a pitch $\lambda$, the other of the first electrode and the second electrode including a portion that faces the branches via the piezoelectric layer,
wherein the thickness h and the pitch $\lambda$ are determined to satisfy an inequality $0.005 \leq h/\lambda \leq 0.1$,
wherein the first electrode has a hillock occurrence rate which is no greater than 0.1%.

6. The piezoelectric element according to claim 1, wherein the common base and the branches belong to the first electrode.

7. The piezoelectric element according to claim 1, wherein the first electrode is formed of an aluminum alloy containing 0.1~3.0 wt % of a metal selected from a group consisting of Ti, Cr, Ni, Cu, Zn, Pd, Ag, Hf, W, Pt and Au.

8. The piezoelectric element according to claim 7, wherein the piezoelectric layer is formed of ZnO doped with Mn.

* * * * *